United States Patent
Yang (12)

(10) Patent No.: US 11,189,731 B2
(45) Date of Patent: Nov. 30, 2021

(54) THIN-FILM TRANSISTOR AND DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Weiwei Yang, Wuhan (CN)

( * ) Notice: Subject to any disclaimer, the term of this patent is extended or adjusted under 35 U.S.C. 154(b) by 258 days.

(21) Appl. No.: 16/349,624

(22) PCT Filed: Mar. 6, 2019

(86) PCT No.: PCT/CN2019/077128
§ 371 (c)(1),
(2) Date: May 14, 2019

(87) PCT Pub. No.: WO2020/124797
PCT Pub. Date: Jun. 25, 2020

(65) Prior Publication Data
US 2021/0184047 A1 Jun. 17, 2021

(30) Foreign Application Priority Data
Dec. 18, 2018 (CN) .......................... 201811547021.X

(51) Int. Cl.
*H01L 29/786* (2006.01)
*H01L 29/417* (2006.01)

(52) U.S. Cl.
CPC .. *H01L 29/78618* (2013.01); *H01L 29/41733* (2013.01)

(58) Field of Classification Search
CPC ................... H01L 29/78618; H01L 29/41733
See application file for complete search history.

(56) References Cited

U.S. PATENT DOCUMENTS

| 2004/0087067 | A1 | 5/2004 | Yoneda et al. |
| 2017/0287947 | A1* | 10/2017 | Li .................... H01L 27/1288 |
| 2019/0386040 | A1* | 12/2019 | Wang ................ H01L 27/124 |

FOREIGN PATENT DOCUMENTS

| CN | 1462481 A | 12/2003 |
| CN | 105742296 A | 7/2016 |
| CN | 106684154 A | 5/2017 |
| CN | 110164868 A | 8/2019 |
| DE | 102016218187 A1 | 10/2017 |
| JP | 2004349451 A | 12/2004 |

* cited by examiner

*Primary Examiner* — Edward Chin

(57) ABSTRACT

The present invention provides a thin-film transistor and a display panel. The thin-film transistor includes a substrate, an active layer, an insulating layer, a metal layer, a dielectric layer, a source electrode, a drain electrode, a first through hole, a second through hole, a third through hole, and a fourth through hole. A first contact portion in a first metal layer is connected to the active layer via the first through hole, and a second contact portion is connected to the active layer via a second through hole. The source electrode is connected to the first contact portion via the third through hole, and the drain electrode is connected to the second contact portion via the fourth through hole.

18 Claims, 4 Drawing Sheets

THIN-FILM TRANSISTOR AND DISPLAY PANEL

BACKGROUND OF INVENTION

1. Field of Invention

The present invention relates to a display field, and particularly, to a thin-film transistor and a display panel.

2. Related Art

In a display field, organic light emitting diode (OLED) devices have attracted wide attention due to advantages of being light in weight, being self-luminous, wide viewing angles, quick response times, and so on. Thin-film transistors (TFTs) are used to drive OLEDs. In an existing process of manufacturing TFT1, as shown in FIG. 1, after a substrate 11, a buffer layer 12, an active layer 13, a first gate insulating layer 14, a first gate electrode 15, a second gate insulating layer 16, a second gate electrode 17, and a dielectric layer 18 are sequentially formed, a through hole a, a through hole b, a through hole c, and a through hole d are simultaneously formed, wherein the through hole a and the through hole c extend from the dielectric layer 18 to the active layer 13, the through hole d extends from the dielectric layer 18 to the first gate electrode 15, and the through hole b extends from the dielectric layer 18 to the second gate electrode 17. Then, a metal material is filled up in the through holes a, b, c, and d to form source and drain electrodes 19. In such a process, in order to improve electrical resistance between the source and drain electrodes 19 and the active layer 13, after the above-mentioned through holes a, b, c, and d are formed, hydrogen fluoride is used for cleaning to remove oxidation on a surface of the active layer 13. However, since hydrogen fluoride is highly corrosive, the first gate electrode 15 and the second gate electrode 17 will be corroded, resulting in abnormal signal transmission, and lowering a yield of the thin-film transistor.

SUMMARY OF INVENTION

An object of the present invention is to provide a thin-film transistor and a display panel to increase a yield of the thin-film transistor.

The present invention provides a thin-film transistor, comprising a substrate; an active layer disposed on the substrate; an insulating layer disposed on the active layer, and comprising a first through hole and a second through hole; a metal layer disposed on the insulating layer, and comprising a first contact portion and a second contact portion both disposed on a same layer and spaced apart from each other, the first contact portion connected to the active layer via the first through hole, the second contact portion connected to the active layer via the second through hole; a dielectric layer disposed on the metal layer, and comprising a third through hole corresponding to the first contact portion, and a fourth through hole corresponding to the second contact portion; and a source electrode and a drain electrode both disposed on a same layer on the dielectric layer, the source electrode connected to the first contact portion via the third through hole, and the drain electrode connected to the second contact portion via the fourth through hole.

In one embodiment of the present invention, the metal layer further comprises a first metal sub-layer, an insulating sub-layer, and a second metal sub-layer, wherein the first metal sub-layer is disposed on the insulating layer; the insulting sub-layer is disposed on the first metal sub-layer; and the second metal sub-layer is disposed on the insulating sub-layer.

In one embodiment of the present invention, the second metal sub-layer comprises the first contact portion and the second contact portion.

In one embodiment of the present invention, the first through hole penetrates the insulating sub-layer and the insulating layer, and the second through hole penetrates the insulating sub-layer and the insulating layer.

In one embodiment of the present invention, the first metal sub-layer comprises the first contact portion and the second contact portion.

In one embodiment of the present invention, the third through hole penetrates the dielectric layer and the insulating sub-layer, and the fourth through hole penetrates the dielectric layer and the insulating sub-layer.

In one embodiment of the present invention, the metal layer is composed of a Mo film layer or a Ti/Al/Ti three-layered film layer.

In one embodiment of the present invention, the metal layer is composed of a Ti/Al/Ti three-layered film layer, the Ti film layer in the first contact portion connected to the source electrode is oxidized to a thickness ranging from 0-30 nanometers, and the Ti film layer in the second contact portion connected to the source electrode is oxidized to a thickness ranging from 0-30 nanometers.

In one embodiment of the present invention, electrical resistance between the source electrode and the first contact portion ranges from 0.01 ohm to 5 ohm, and electrical resistance between the drain electrode and the second contact portion ranges from 0.01 ohm to 5 ohm.

In one embodiment of the present invention, the first through hole and the third through hole are disposed corresponding to each other, or part of the first through hole and part of the third through hole are disposed corresponding to each other, and the second through hole and the fourth through hole are disposed corresponding to each other, or part of the second through hole and part of the fourth through hole are disposed corresponding to each other.

The present invention further provides a display panel, comprising a thin-film transistor, the thin-film transistor comprising: a substrate; an active layer disposed on the substrate; an insulating layer disposed on the active layer, and comprising a first through hole and a second through hole; a metal layer disposed on the insulating layer, and comprising a first contact portion and a second contact portion both disposed on a same layer and spaced apart from each other, the first contact portion connected to the active layer via the first through hole, the second contact portion connected to the active layer via the second through hole; a dielectric layer disposed on the metal layer, and comprising a third through hole corresponding to the first contact portion, and a fourth through hole corresponding to the second contact portion; and a source electrode and a drain electrode both disposed on a same layer on the dielectric layer, the source electrode connected to the first contact portion via the third through hole, and the drain electrode connected to the second contact portion via the fourth through hole.

In one embodiment of the present invention, the metal layer further comprises a first metal sub-layer, an insulating sub-layer, and a second metal sub-layer, wherein the first metal sub-layer is disposed on the insulating layer; the insulting sub-layer is disposed on the first metal sub-layer; and the second metal sub-layer is disposed on the insulating sub-layer.

In one embodiment of the present invention, the second metal sub-layer comprises the first contact portion and the second contact portion.

In one embodiment of the present invention, the first through hole penetrates the insulating sub-layer and the insulating layer, and the second through hole penetrates the insulating sub-layer and the insulating layer.

In one embodiment of the present invention, the first metal sub-layer comprises the first contact portion and the second contact portion.

In one embodiment of the present invention, the third through hole penetrates the dielectric layer and the insulating sub-layer, and the fourth through hole penetrates the dielectric layer and the insulating sub-layer.

In one embodiment of the present invention, the metal layer is composed of a Mo film layer or a Ti/Al/Ti three-layered film layer.

In one embodiment of the present invention, the metal layer is composed of a Ti/Al/Ti three-layered film layer, the Ti film layer in the first contact portion connected to the source electrode is oxidized to a thickness ranging from 0-30 nanometers, and the Ti film layer in the second contact portion connected to the source electrode is oxidized to a thickness ranging from 0-30 nanometers.

In one embodiment of the present invention, electrical resistance between the source electrode and the first contact portion ranges from 0.01 ohm to 5 ohm, and electrical resistance between the drain electrode and the second contact portion ranges from 0.01 ohm to 5 ohm.

In one embodiment of the present invention, the first through hole and the third through hole are disposed corresponding to each other, or part of the first through hole and part of the third through hole are disposed corresponding to each other, and the second through hole and the fourth through hole are disposed corresponding to each other, or part of the second through hole and part of the fourth through hole are disposed corresponding to each other.

The thin-film transistor and the display panel of the embodiments of the invention utilize the first through hole and the second through hole to enable a connection of the metal layer and the active layer, and utilize the third through hole and the fourth through hole to enable a connection of the metal layer and the source and drain electrodes, thereby to allow the active layer to be electrically connected to the source electrode and the drain electrode through the metal layer, increasing a yield of the thin-film transistor.

BRIEF DESCRIPTION OF DRAWINGS

In order to make the above-mentioned contents of the present invention more comprehensible, the preferred embodiments are described below, and the detailed description is as follows.

DESCRIPTION OF PREFERRED EMBODIMENTS

Figure 1:
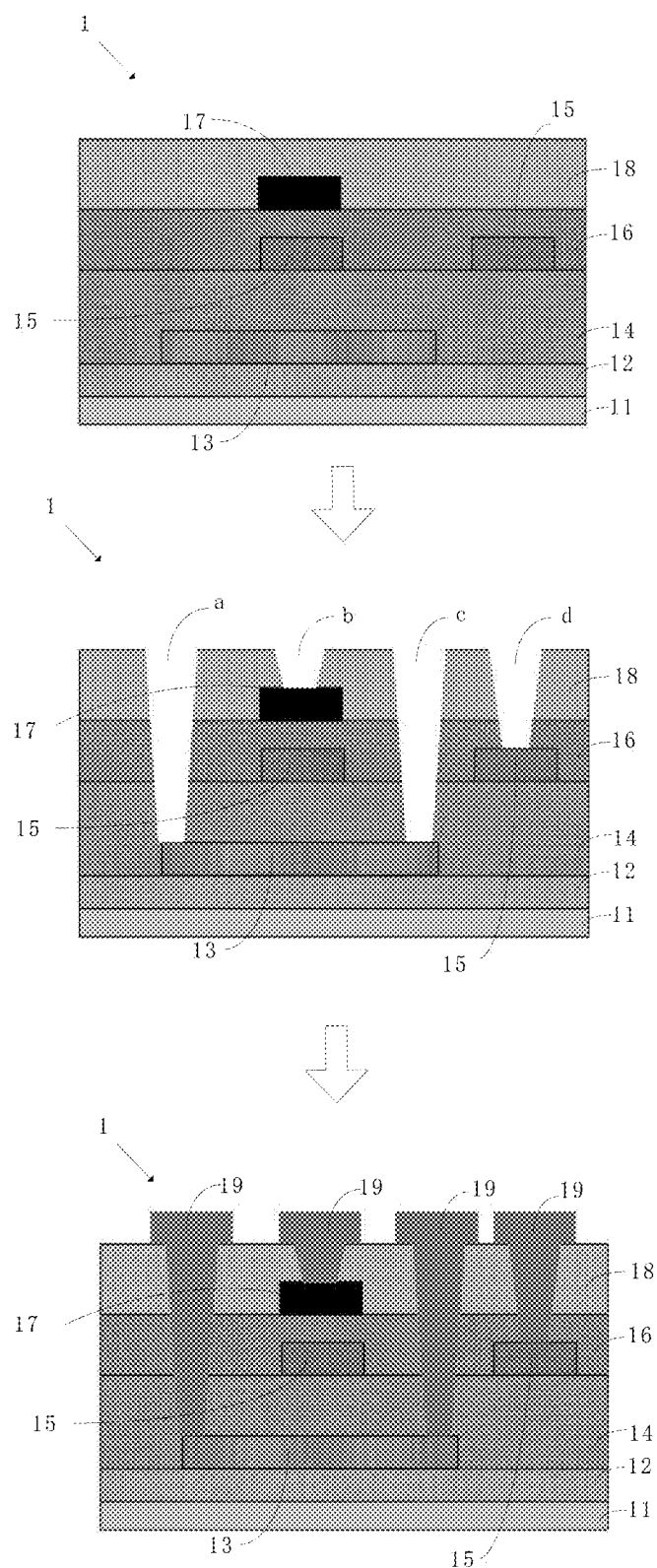
FIG. 1 is a flowchart showing a method of manufacturing an existing thin-film transistor.

The following embodiments are referring to the accompanying drawings for exemplifying specific implementable embodiments of the present disclosure. Furthermore, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto.

In the drawings, elements with similar structures are labeled with like reference numerals.

References to "an embodiment" herein mean that a particular feature, structure, or characteristic described in connection with the embodiments can be included in at least one embodiment of the invention. The appearances of the phrases in various places in the specification are not necessarily referring to same embodiments, and are not exclusive or alternative embodiments that are mutually exclusive. Those skilled in the art will understand and implicitly understand that the embodiments described herein can be combined with other embodiments.

Figure 2:
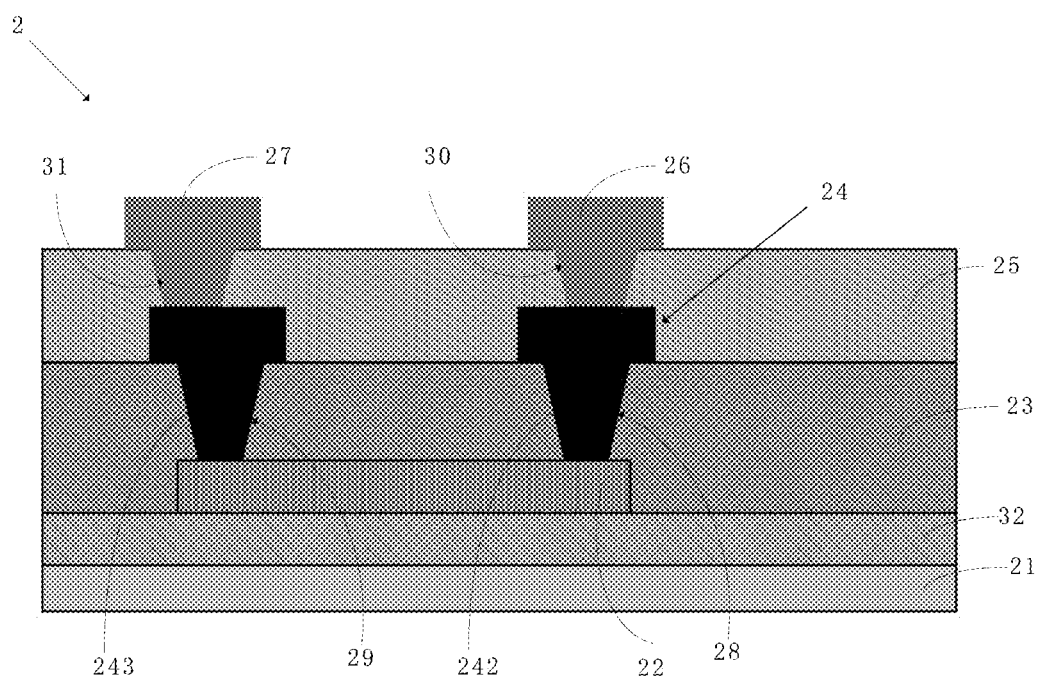
FIG. 2 is a schematic structural view of a thin-film transistor according to an embodiment of the present invention.

An embodiment of the present invention provides a thin-film transistor and a display panel, wherein the display panel includes the thin-film transistor. Please refer to FIG. 2. FIG. 2 is a schematic structural view of a thin-film transistor according to an embodiment of the present invention. As shown in FIG. 2, the thin-film transistor includes a substrate 21, an active layer 22, an insulating layer 23, a metal layer 24, a dielectric layer 25, a drain electrode 27, a first through hole 28, a second through hole 29, a third through hole 30, and a fourth through hole 31.

The substrate 21 is configured to support the active layer 22, the insulting layer 23, etc. The substrate 21 may be a flexible substrate made of a flexible material such as polyimide, or may be a rigid substrate, such as a glass substrate.

The active layer 22 is disposed on the substrate 21 and is made of amorphous silicon (a-si) or polycrystalline silicon (P-si). As shown in FIG. 2, a buffer layer 32 is further disposed between the substrate 21 and the active layer 22. The buffer layer 32 may be made of SiNx, SiOx, etc.

The insulating layer 23 is disposed on the active layer 22. The insulating layer 23 may be perforated to form the first through hole 28 and the second through hole 29, that is, the first through hole 28 and the second through hole 29 are disposed on the insulating layer 23. It should be noted that after the first through hole 28 and the second through hole 29 are formed, the first through hole 28 and the second through hole 29 may be cleaned by using hydrogen fluoride to remove oxide in the first through hole 28 and the second through hole 29.

The metal layer 24 is disposed on the insulating layer 23. Specifically, first, the first through hole 28 and the second through hole 29 are filled with a metal material, such as molybdenum (Mo) or titanium/aluminum/titanium (Ti/Al/Ti). That is, the metal layer 24 is made of a Mo film layer or a Ti/Al/Ti three-layered film layer. The metal material is then covered with the insulating layer 23 and patterned to form the metal layer 24.

In one embodiment, as shown in FIG. 2, the metal layer 24 includes a first contact portion 242 and a second contact portion 243 both disposed on a same layer and spaced apart from each other. The first contact portion 242 is connected to the active layer 22 via the first through hole 28, and the second contact portion 243 is connected to the active layer 22 via the second through hole 29.

The dielectric layer 25 is disposed on the metal layer 24. The dielectric layer 25 may be perforated to form the third through hole 30 and the fourth through hole 31, that is, the third through hole 30 and the fourth through hole 31 are disposed on the dielectric layer 25.

Figure 3:
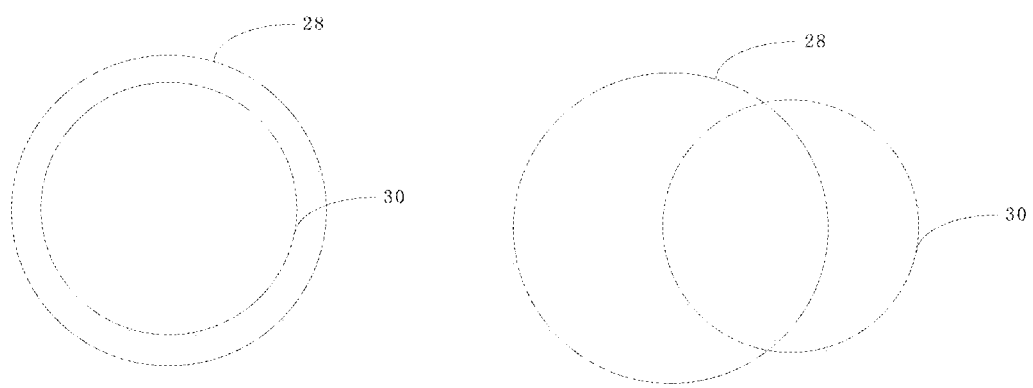
FIG. 3 is a schematic view showing relationships of locations of a first through hole and a second through hole according to an embodiment of the present invention.

As shown in FIG. 3, the first through hole 28 and the third through hole 30 are disposed corresponding to each other, or part of the first through hole 28 and part of the third through hole 30 are disposed corresponding to each other. Likewise, the second through hole 29 and the fourth through hole 31 are disposed corresponding to each other, or part of the second through hole 29 and part of the fourth through hole 31 are disposed corresponding to each other. It should be noted that a diameter of the first through hole 28 may be greater than a diameter of the third through hole 30, or may be less than or equal to a diameter of the third through hole 30. A diameter of the second through hole 29 may be greater than a diameter of the fourth through hole 31, or may be less than or equal to a diameter of the fourth through hole 31, which is not specifically limited herein.

The source electrode 26 and the drain electrode 27 are both disposed on a same layer on the dielectric layer 25. Specifically, Ti/Al/Ti may be filled into the third through hole 30 and the fourth through hole 31, and the dielectric layer 25 may be covered and patterned to form the source electrode 26 and the drain electrode 27 as shown in FIG. 1.

The source electrode 26 is connected to the first contact portion 242 via the third through hole 30, and the drain electrode 27 is connected to the second contact portion 243 via the fourth through hole 31. In this manner, the source electrode 26 and the drain electrode 27 may be connected to the active layer 22 through the first contact portion 242 and the second contact portion 243 of the metal layer 24 as a bridge. It should be noted that the third through hole 30 and the fourth through hole 31 so formed do not need to be treated with hydrogen fluoride, that is, the metal layer 24 is prevented from being corroded by hydrogen fluoride.

Furthermore, when the metal layer 24 is composed of the Ti/Al/Ti three-layered film layer, that is, when the first contact portion 242 and the second contact portion 243 are both composed of the Ti/Al/Ti three-layered film layer, the Ti film in the metal layer 24 is to be oxidized, forming TiOx, wherein a thickness of TiOx is generally ranged from 0-50 nanometers. It should be noted that an oxidized thickness of the Ti film layer in the first contact portion 242 connected to the source electrode 26, and an oxidized thickness of the Ti film layer in the second contact portion 243 connected to the drain electrode 27, are significantly influencing electrical resistance between the metal layer 24 and the source electrode 26 and the drain electrode 27.

In an embodiment of the present invention, depths of the third through hole 30 and the fourth through hole 31 can be effectively controlled, that is, TiOx in the first contact portion 242 in contact with the source electrode 26 can be effectively removed, and TiOx in the second contact portion 243 in contact with the drain electrode 27 can be effectively removed. Preferably, an oxidized thickness of TiOx in the first contact portion 242 in contact with the source electrode 26 is controlled to be in a range of 0-30 nanometers, and an oxidized thickness of TiOx in the second contact portion 243 in contact with the drain electrode 27 is controlled to be in a range of 0-30 nanometers.

Accordingly, electrical resistance between the source electrode 26 and the first contact portion 242 can be controlled to be in a range of 0.01-5 ohms, and electrical resistance between the drain layer 27 and the second contact portion 243 can be controlled to be in a range of 0.01-5 ohms.

Figure 4:
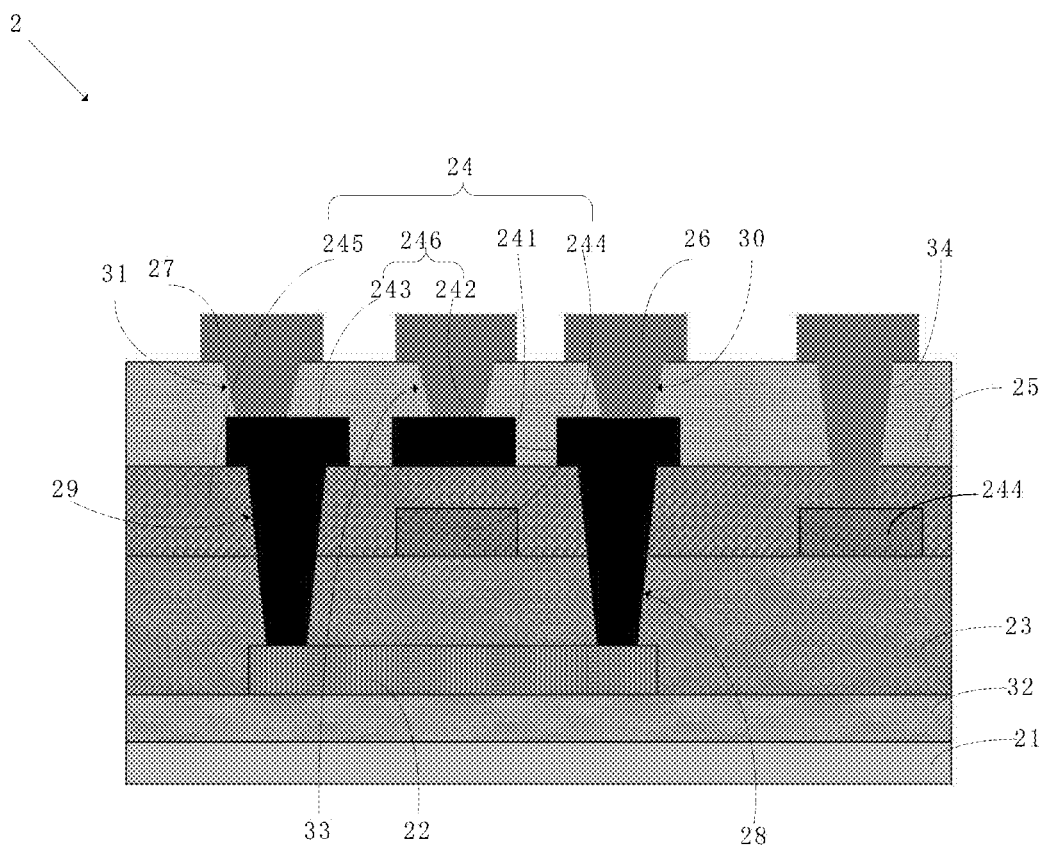
FIG. 4 is another schematic structural view of a thin-film transistor according to an embodiment of the present invention.
Figure 5:
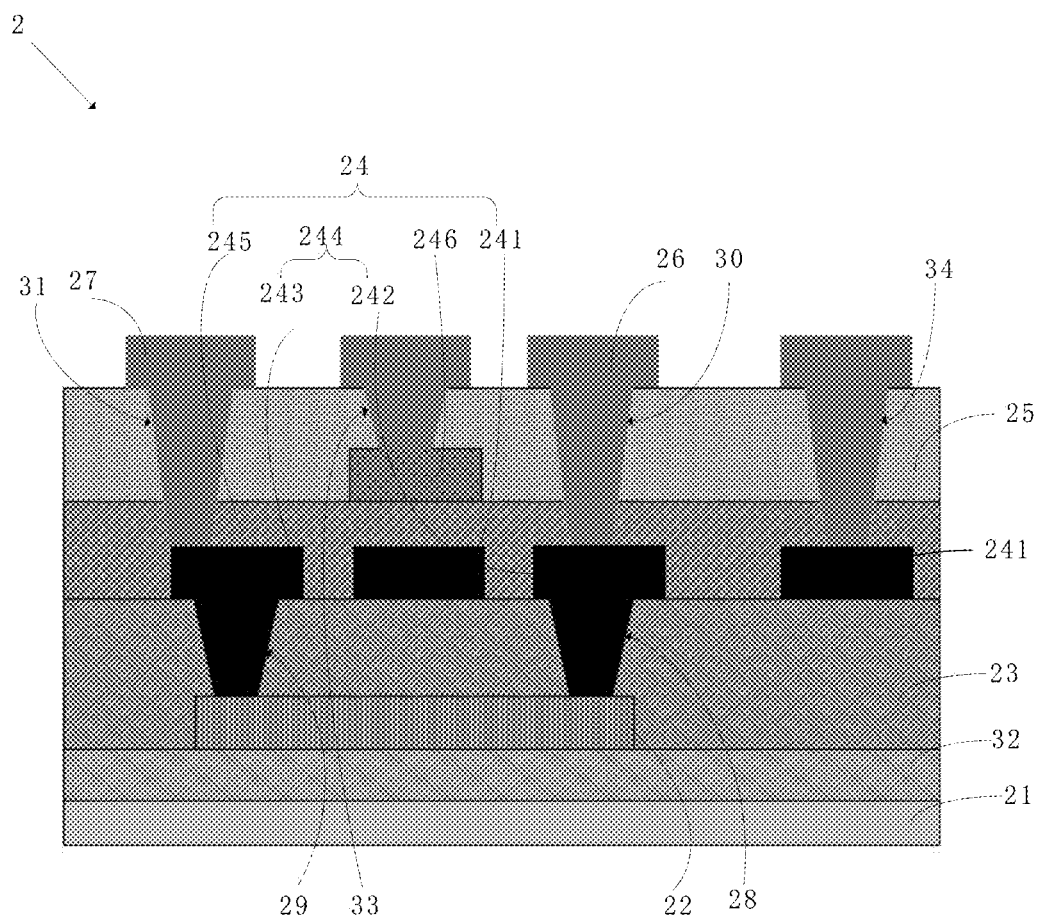
FIG. 5 is another schematic structural view of a thin-film transistor according to an embodiment of the present invention.

In certain embodiments, as shown in FIG. 4 or 5, the metal layer 24 further includes a first metal sub-layer 244, an insulating sub-layer 245, and a second metal sub-layer 246. The first metal sub-layer 244 is disposed on the insulating layer 23, the insulting sub-layer 245 is disposed on the first metal sub-layer 244, and the second metal sub-layer 246 is disposed on the insulating sub-layer 245.

As shown in FIG. 4, the second metal sub-layer 246 includes the first contact portion 242 and the second contact portion 243. In this manner, the third through hole 30 and the fourth through hole 31 are still disposed on the dielectric layer 25. The first through hole 28 penetrates the insulating sub-layer 245 and the insulating layer 23, and the second through hole 29 penetrates the insulating sub-layer 245 and the insulating layer 23.

As shown in FIG. 5, the first metal sub-layer 244 includes the first contact portion 242 and the second contact portion 243. In this manner, the first through hole 28 and the second through hole 29 are still disposed on the insulating layer 23. The third through hole 30 penetrates the dielectric layer 25 and the insulating sub-layer 245, and the fourth through hole 31 penetrates the dielectric layer 25 and the insulating sub-layer 245.

Furthermore, as shown in FIG. 4 or 5, the metal layer 24 further includes a metal sub-layer 241. The metal sub-layer 241, the first contact portion 242, and the second contact portion 243 are disposed on a same layer and spaced apart from each other. In one embodiment, the first contact portion 242 and the second contact portion 243 may be disposed on both sides of the metal sub-layer 241.

In one embodiment, first, the insulating layer 23 and the insulating sub-layer 245 may be perforated to form the first through hole 28 and the second through hole 29. Then, the first through hole 28 and the second through hole 29 are sequentially filled with Ti, Al, and Ti, and covered on the insulating sub-layer 245. Finally, a patterning process is performed to form the first contact portion 242, the second contact portion 243, and the metal sub-layer 241 as shown in FIG. 4. In this manner, a capacitor is formed by the metal sub-layer 241 and the first metal sub-layer 244 disposed opposite to the metal sub-layer 241.

In one embodiment, first, the insulating layer 23 may also be perforated to form the first through hole 28 and the second through hole 29. Then, the first through hole 28 and the second through hole 29 are sequentially filled with Ti, Al, and Ti, and covered on the insulating layer 23. Finally, a patterning process is performed to form the first contact portion 242, the second contact portion 243, and the metal sub-layer 241 as shown in FIG. 5. In this manner, a capacitor is formed by the metal sub-layer 241 and the second metal sub-layer 246 disposed opposite to the metal sub-layer 241.

In summary, the first contact portion 242, the second contact portion 243, and the metal sub-layer 241 can be formed by a single process.

Accordingly, the thin-film transistor 2 further includes a fifth through hole 33 and a sixth through hole 34. As shown in FIG. 4, the fifth through hole 33 is disposed on the dielectric layer 25 to connect the source electrode 26 or the drain electrode 27 to the metal sub-layer 241. The sixth through hole 34 is disposed on the dielectric layer 25 and the insulating sub-layer 245 to connect the source electrode 26 or the drain electrode 27 to the first metal sub-layer 244. As shown in FIG. 5, the fifth through hole 33 is disposed on the dielectric layer 25 to connect the source electrode 26 or the drain electrode 27 to the second metal sub-layer 246. The sixth through hole 34 is disposed on the dielectric layer 25 and the insulating sub-layer 245 to connect the source electrode 26 or the drain electrode 27 to the metal sub-layer 241.

The thin-film transistor and the display panel of the embodiments of the present invention utilize the first through hole and the second through hole to enable a connection of the metal layer and the active layer, and utilize the third through hole and the fourth through hole to enable a connection of the metal layer and the source and drain electrodes, thereby to allow the active layer to be electrically connected to the source electrode and the drain electrode through the metal layer, increasing a yield of the thin-film transistor.

Accordingly, the present invention has been disclosed in the above preferred embodiments, but the preferred embodiments are not intended to limit the present invention, and those skilled in the art can make various modifications without departing from the spirit and scope of the invention. Therefore, the scope of the invention is defined by the scope defined by the claims.

What is claimed is:

1. A thin-film transistor, comprising:
   a substrate;
   an active layer disposed on the substrate;
   an insulating layer disposed on the active layer, and comprising a first through hole and a second through hole;
   a metal layer disposed on the insulating layer, and comprising a first contact portion and a second contact portion both disposed on a same layer and spaced apart from each other, a metal sub-layer, a first metal sub-layer, an insulating sub-layer, and a second metal sub-layer, wherein the first metal sub-layer is disposed on the insulating layer, the insulting sub-layer is disposed on the first metal sub-layer, the second metal sub-layer is disposed on the insulating sub-layer, the metal sub-layer is disposed between the first contact portion and the second contact portion, the first contact portion is connected to the active layer via the first through hole, and the second contact portion is connected to the active layer via the second through hole, wherein the metal sub-layer, the first contact portion, and the second contact portion are disposed on the same layer and spaced apart from each other, and the metal sub-layer, the insulating sub-layer, and the first metal sub-layer disposed opposite to the metal sub-layer collectively allow for formation of a capacitor;
   a dielectric layer disposed on the metal layer, and comprising a third through hole corresponding to the first contact portion, and a fourth through hole corresponding to the second contact portion; and
   a source electrode and a drain electrode both disposed on a same layer on the dielectric layer, the source electrode connected to the first contact portion via the third through hole, and the drain electrode connected to the second contact portion via the fourth through hole.

2. The thin-film transistor of claim 1, wherein the second metal sub-layer comprises the first contact portion and the second contact portion.

3. The thin-film transistor of claim 2, wherein the first through hole penetrates the insulating sub-layer and the insulating layer, and the second through hole penetrates the insulating sub-layer and the insulating layer.

4. The thin-film transistor of claim 1, wherein the first metal sub-layer comprises the first contact portion and the second contact portion.

5. The thin-film transistor of claim 4, wherein the third through hole penetrates the dielectric layer and the insulating sub-layer, and the fourth through hole penetrates the dielectric layer and the insulating sub-layer.

6. The thin-film transistor of claim 1, wherein the metal layer is composed of a molybdenum (Mo) film layer or a titanium/aluminum/titanium (Ti/Al/Ti) three-layered film layer.

7. The thin-film transistor of claim 1, wherein the metal layer is composed of a Ti/Al/Ti three-layered film layer, the Ti film layer in the first contact portion connected to the source electrode is oxidized to a thickness ranging from 0-30 nanometers, and the Ti film layer in the second contact portion connected to the source electrode is oxidized to a thickness ranging from 0-30 nanometers.

8. The thin-film transistor of claim 7, where electrical resistance between the source electrode and the first contact portion ranges from 0.01 ohm to 5 ohm, and electrical resistance between the drain electrode and the second contact portion ranges from 0.01 ohm to 5 ohm.

9. The thin-film transistor of claim 1, wherein the first through hole and the third through hole are disposed corresponding to each other, or part of the first through hole and part of the third through hole are disposed corresponding to each other, and the second through hole and the fourth through hole are disposed corresponding to each other, or part of the second through hole and part of the fourth through hole are disposed corresponding to each other.

10. A display panel, comprising a thin-film transistor, the thin-film transistor comprising:
    a substrate;
    an active layer disposed on the substrate;
    an insulating layer disposed on the active layer, and comprising a first through hole and a second through hole;
    a metal layer disposed on the insulating layer, and comprising a first contact portion and a second contact portion both disposed on a same layer and spaced apart from each other, a metal sub-layer, a first metal sub-layer, an insulating sub-layer, and a second metal sub-layer, wherein the first metal sub-layer is disposed on the insulating layer, the insulting sub-layer is disposed on the first metal sub-layer, the second metal sub-layer is disposed on the insulating sub-layer, the metal sub-layer is disposed between the first contact portion and the second contact portion, the first contact portion is connected to the active layer via the first through hole, and the second contact portion is connected to the active layer via the second through hole, wherein the metal sub-layer, the first contact portion, and the second contact portion are disposed on the same layer and spaced apart from each other, and the metal sub-layer, the insulating sub-layer, and the first metal sub-layer disposed opposite to the metal sub-layer collectively allow for formation of a capacitor;
    a dielectric layer disposed on the metal layer, and comprising a third through hole corresponding to the first contact portion, and a fourth through hole corresponding to the second contact portion; and
    a source electrode and a drain electrode both disposed on a same layer on the dielectric layer, the source electrode connected to the first contact portion via the third through hole, and the drain electrode connected to the second contact portion via the fourth through hole.

11. The display panel of claim 10, wherein the second metal sub-layer comprises the first contact portion and the second contact portion.

12. The display panel of claim 11, wherein the first through hole penetrates the insulating sub-layer and the insulating layer, and the second through hole penetrates the insulating sub-layer and the insulating layer.

13. The display panel of claim 10, wherein the first metal sub-layer comprises the first contact portion and the second contact portion.

14. The display panel of claim 13, wherein the third through hole penetrates the dielectric layer and the insulating sub-layer, and the fourth through hole penetrates the dielectric layer and the insulating sub-layer.

15. The display panel of claim 10, wherein the metal layer is composed of a Mo film layer or a Ti/Al/Ti three-layered film layer.

16. The display panel of claim 10, wherein the metal layer is composed of a Ti/Al/Ti three-layered film layer, the Ti film layer in the first contact portion connected to the source electrode is oxidized to a thickness ranging from 0-30 nanometers, and the Ti film layer in the second contact portion connected to the source electrode is oxidized to a thickness ranging from 0-30 nanometers.

17. The display panel of claim 16, where electrical resistance between the source electrode and the first contact portion ranges from 0.01 ohm to 5 ohm, and electrical resistance between the drain electrode and the second contact portion ranges from 0.01 ohm to 5 ohm.

18. The display panel of claim 10, wherein the first through hole and the third through hole are disposed corresponding to each other, or part of the first through hole and part of the third through hole are disposed corresponding to each other, and the second through hole and the fourth through hole are disposed corresponding to each other, or part of the second through hole and part of the fourth through hole are disposed corresponding to each other.

* * * * *